(12) United States Patent
Kim

(10) Patent No.: US 11,927,623 B2
(45) Date of Patent: Mar. 12, 2024

(54) SEMICONDUCTOR TEST DEVICE INCLUDING TEMPERATURE CONTROL MODULE AND METHOD OF DRIVING THE SAME

(71) Applicant: SK hynix Inc., Gyeonggi-do (KR)

(72) Inventor: Nack Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/846,534

(22) Filed: Jun. 22, 2022

(65) Prior Publication Data
US 2023/0133368 A1 May 4, 2023

(30) Foreign Application Priority Data
Nov. 3, 2021 (KR) .................. 10-2021-0149556

(51) Int. Cl.
*G01R 31/28* (2006.01)

(52) U.S. Cl.
CPC ..... *G01R 31/2891* (2013.01); *G01R 31/2862* (2013.01); *G01R 31/2863* (2013.01); *G01R 31/2865* (2013.01); *G01R 31/2875* (2013.01); *G01R 31/2887* (2013.01)

(58) Field of Classification Search
CPC ............ G01R 31/2862; G01R 31/2863; G01R 31/2865; G01R 31/2874; G01R 31/2875; G01R 31/2877; G01R 31/2887; G01R 31/2891; G01R 31/2868; H05K 1/14; H05K 7/00; H05K 7/1424
See application file for complete search history.

(56) References Cited

U.S. PATENT DOCUMENTS

| | | | | |
|---|---|---|---|---|
| 3,656,058 | A * | 4/1972 | Leathers | H01R 31/00 324/756.05 |
| 4,967,155 | A * | 10/1990 | Magnuson | G11B 20/1816 361/679.48 |
| 7,084,655 | B2 * | 8/2006 | Min | G01R 31/2877 324/750.08 |
| 7,111,211 | B1 * | 9/2006 | Co | G01R 31/2855 714/724 |
| 11,519,958 | B2 * | 12/2022 | Kim | G01R 31/2875 |

FOREIGN PATENT DOCUMENTS

KR 10-0561951 B1 3/2006
KR 10-1878322 B1 7/2018

* cited by examiner

*Primary Examiner* — Vinh P Nguyen
(74) *Attorney, Agent, or Firm* — IP & T GROUP LLP

(57) ABSTRACT

A semiconductor test device may include a chamber, a plurality of slots, a plurality of test boards and a plurality of temperature control modules. The slots may be arranged in the chamber. The test boards may be inserted into a part of the slots. The test boards may be configured to receive a plurality of semiconductor devices. The temperature control modules and the test boards may be alternately inserted into other parts of the slots. The temperature control modules may be configured to provide each of the test boards with air having a set temperature.

11 Claims, 5 Drawing Sheets

SEMICONDUCTOR TEST DEVICE INCLUDING TEMPERATURE CONTROL MODULE AND METHOD OF DRIVING THE SAME

CROSS-REFERENCES TO RELATED APPLICATION

The present application claims priority under 35 U.S.C. § 119(a) to Korean application number 10-2021-0149556, filed on Nov. 3, 2021, in the Korean Intellectual Property Office, which is incorporated herein by reference in its entirety.

BACKGROUND

1. Technical Field

Various embodiments generally relate to a semiconductor device and, more particularly, to a semiconductor test device and a method of driving the semiconductor test device.

2. Related Art

A semiconductor test may include applying an electrical condition to a semiconductor device at an extreme temperature, for example, about −30° C. or about 120° C. to check the characteristics of a defect in the semiconductor device. Particularly, a burn-in test may apply a thermal stress to the semiconductor device at a high temperature of about 80° C. to about 120° C. During the burn-in test, the semiconductor device is operated subjected to the high temperature and a high electric field so that an error mechanism may be accelerated. Thus, an abnormal semiconductor device having a short life span may not endure the severe condition of the burn-in test and may generate an error. A normal semiconductor device passing through the burn-in test may have a long life span so that a system employing the normal semiconductor device may exhibit improved reliability.

In the burn-in test, the semiconductor device may be received in a burn-in board. The burn-in board may be inserted into a rack with slots configured to receive the burn-in boards. The rack may be positioned in a burn-in chamber to perform the burn-in test. Because the burn-in boards may be inserted into the slots, one rack may be configured to receive the numerous semiconductor devices. Generally, four wide racks with the semiconductor devices may be loaded into one burn-in chamber to test the semiconductor devices.

However, the burn-in chamber may not have a uniform temperature. That is, a temperature of a semiconductor device adjacent to a heat source may be different from a temperature of a semiconductor device remote from the heat source. Thus, the burn-in test may have low accuracy and reliability.

SUMMARY

According to example embodiments, there may be provided a semiconductor test device including a chamber, a plurality of slots, a plurality of test boards and a plurality of temperature control modules. The slots may be arranged in the chamber. The test boards may be inserted into a part of the slots. The test boards may be configured to receive a plurality of semiconductor devices. The temperature control modules and the test boards may be alternately inserted into other parts of the slots. The temperature control modules may be configured to provide each of the test boards with air having a set temperature.

According to example embodiments, there may be provided a method of driving a semiconductor test device. In the method of driving the semiconductor test device, a first temperature of air introduced into a chamber may be measured. A second temperature of air provided to a plurality of semiconductor devices in the chamber may then be measured. When the second temperature may be beyond a set temperature, the second temperature may be controlled using a temperature control module to provide the semiconductor devices with the set temperature. The temperature control module may include an upper region, a middle region and a lower region. Inflow units configured to introducing the air into the chamber may be arranged in the upper region. The middle region may have a hollow shape to mix the air introduced by the inflow units. Outflow units configured to discharge a mixed air to the semiconductor devices in a test board may be arranged in the lower region. The temperature control module may control the inflow units and the outflow units to provide the semiconductor devices with the set temperature.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
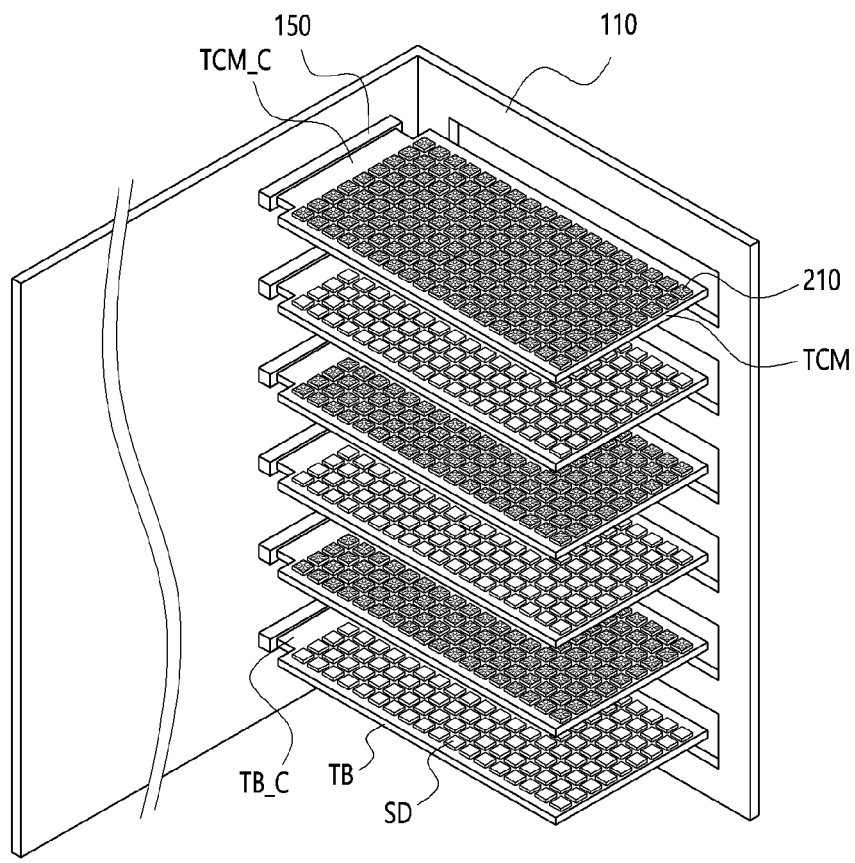
FIG. 1 is a perspective view illustrating a semiconductor test device in accordance with example embodiments.
Figure 2:
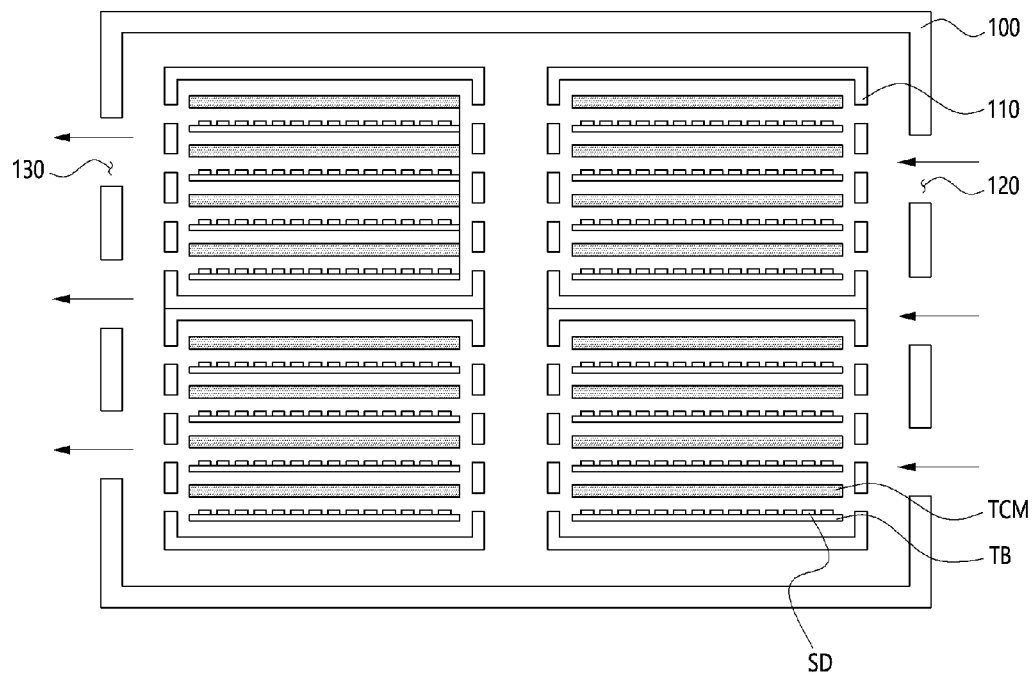
FIG. 2 is a cross-sectional view illustrating a semiconductor test device in accordance with example embodiments.

FIG. 1 is a perspective view illustrating a semiconductor test device in accordance with example embodiments and FIG. 2 is a cross-sectional view illustrating a semiconductor test device in accordance with example embodiments.

Referring to FIGS. 1 and 2, a semiconductor test device 1000 may include a chamber 100, a plurality of slots 150 and a temperature control module TCM.

The chamber 100 may have a space configured to receive a plurality of test boards TB. The chamber 100 may include an inlet 120 configured to provide air in the chamber 100 and an outlet 130 configured to discharge the air from the chamber 100. A temperature in the chamber 100 may be constantly maintained by the air introduced through the inlet 120.

In the example of FIGS. 1 and 2, three inlets 120 may be formed through a sidewall of the chamber 100, however the invention is not limited thereto. For example, an emit device having a plurality of holes may be installed at the inlet 120 to uniformly supply the air into the chamber 100.

Each of the test boards TB may include a test region in which a plurality of semiconductor devices SD may be positioned and an electrical connection configured to transmit a test signal to the semiconductor devices SD which are positioned on the test region. For example, the semiconductor devices SD may be arranged in a matrix shape spaced apart from each other at a regular interval on a top surface of the test board TB. The electrical connection TB_C may be coupled to each of the plurality of the semiconductor devices SD positioned on the test region to allow individual control of each of the semiconductor devices SD.

The space in the chamber 100 may include a plurality of racks 110. In the example of FIG. 1, two racks 110 may be arranged in one chamber 100, not limited thereto. Each rack 110 may be divided into two sub-racks.

A plurality of slots 150 may be vertically arranged at each of the rack 110. The test board TB may be inserted into each of the slots 150. The electrical connection TB_C of each of the test boards TB may be inserted into the slot 150 to receive the test signal.

In example embodiments, the test boards TB and the temperature control modules TCM may be alternately inserted into the slots 150. For example, the test boards TB may be inserted into odd numbers of the slots 150. The temperature control modules TCM may be inserted into even numbers of the slots 150. Thus, one temperature control module TCM may be arranged over one test board TB. That is, a test board TB and a temperature control module TCM positioned immediately over to the test board TB may form one set or a pair. In this case, the temperature control module TCM may supply the air to a top surface of its paired test board TB.

Alternatively, in a modified example the test board TB and the temperature control module TCM under the test board TB may form one set. In this case, the temperature control module TCM may supply the air to a lower surface of its paired test board TB.

Each of the temperature control modules TCM may maintain the temperature of the air introduced through the inlet 120 of the chamber 100 constant to provide the semiconductor devices SD of the test board TB with the air having the same temperature. Generally, the air introduced into the chamber 100 may have a temperature deviation depending upon the precise location inside the chamber 100. Thus, different regions inside the chamber 100 may have different temperatures without the temperature control modules TCM controlling the flow and temperature of the air supplied to a region in order to maintain a constant temperature inside the chamber 100. For example, the air introduced through the inlet 120 of the chamber 100 may be swirled by the test board TB and/or the rack 110 so that the air in the chamber 100 may have different temperatures. When a temperature deviation is generated in the chamber 100, the semiconductor devices SD of the test board TB may not be normally tested and decrease accuracy and reliability of the test. The present invention solves this problem by employing the plurality of the temperature control modules TCM which are capable of maintaining a constant temperature of the air in the chamber 100 regardless of the region in the chamber 100.

Hereinafter, the temperature control module TCM is illustrated in detail.

Figure 3:
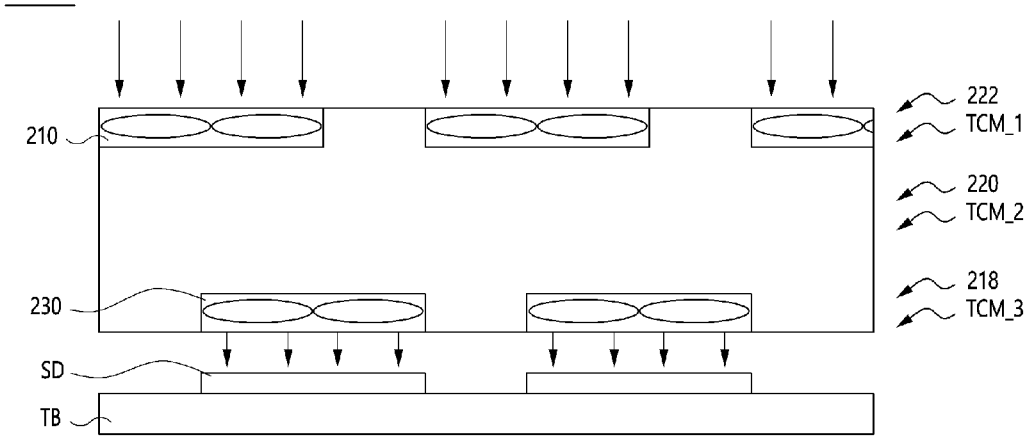
FIGS. 3 to 7 are views illustrating various structures of a temperature control module in accordance with example embodiments.
Figure 4:
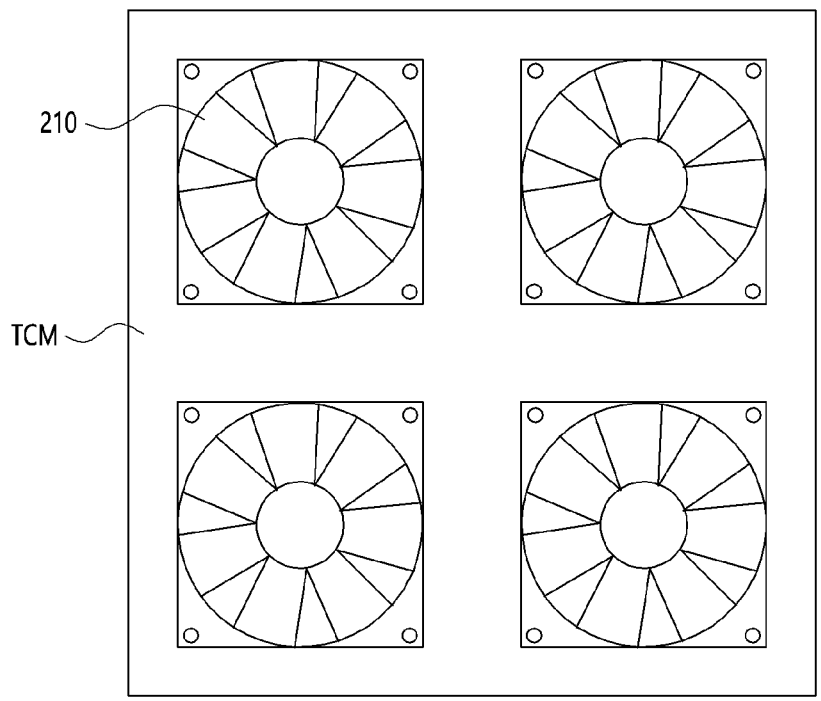

FIGS. 3 to 7 are views illustrating various structures of a temperature control module in accordance with example embodiments of the present invention. FIGS. 3, 5, 6 and 7 are cross-sectional views illustrating the various structures of the temperature control module TCM. FIG. 4 is a plan view illustrating the various structures of the temperature control module TCM.

Referring to FIGS. 3 to 7, the temperature control module TCM may include an upper region 222 which is the region where the inflow units 210 are arranged, and a lower region 218 which is the region where the outflow units 230 are arranged. The temperature control module TCM may further include a middle region 220 which is the region between the upper region 222 and the lower region 218. The middle region 220 is the region where the air is mixed. In the example embodiments described herein, a lower surface of the temperature control module TCM may face the semiconductor devices SD of the test board TB.

The temperature control module TCM may suck the air introduced into the chamber 100 through the inflow units 210. In example embodiments, the inflow units 210 may include a fan, as for example is shown in FIG. 4. The inflow units 210 may be configured to compress the air.

Figure 5:
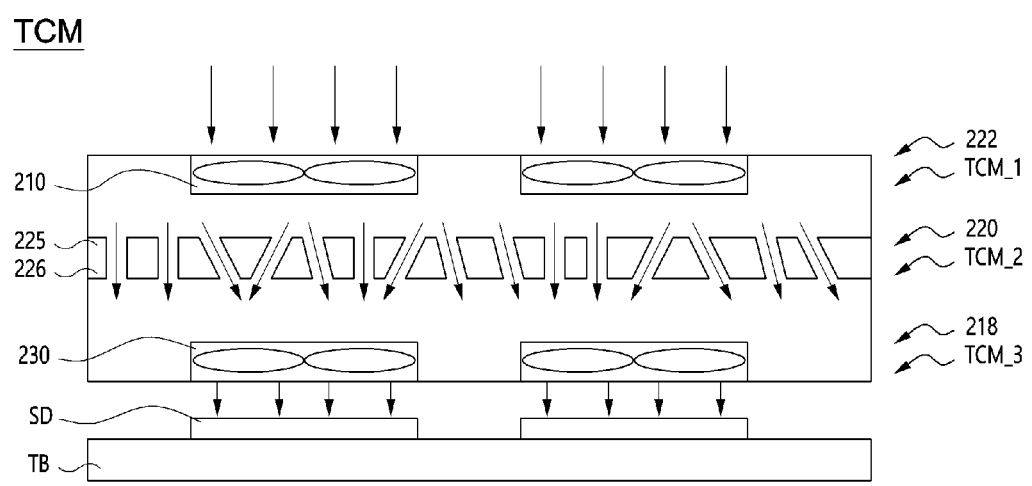

The inflow units 210 may be arranged in a matrix shape. In example embodiments, as shown in FIGS. 4 and 5, numbers of the inflow units 210 may be substantially the same as numbers of the outflow units 230. Each of the inflow units 210 may be arranged to correspond to each of the outflow units 230.

Figure 6:
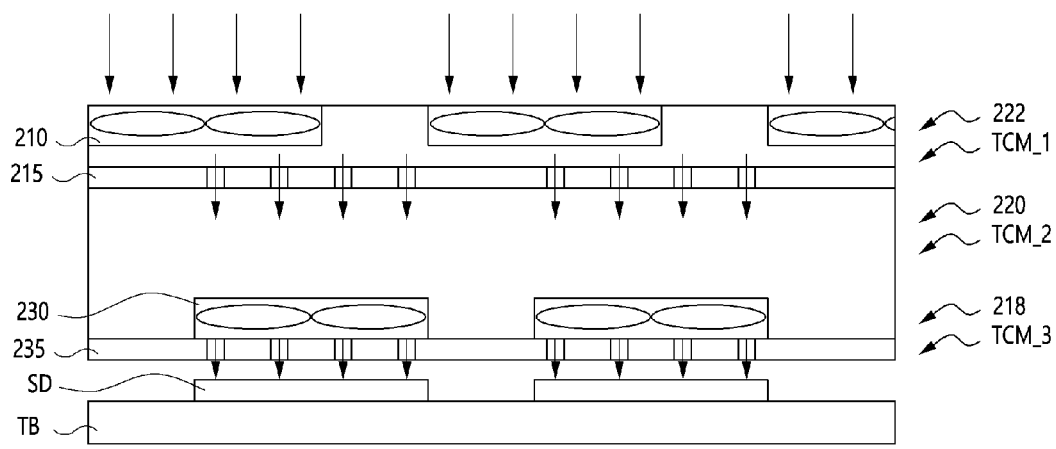
Figure 7:
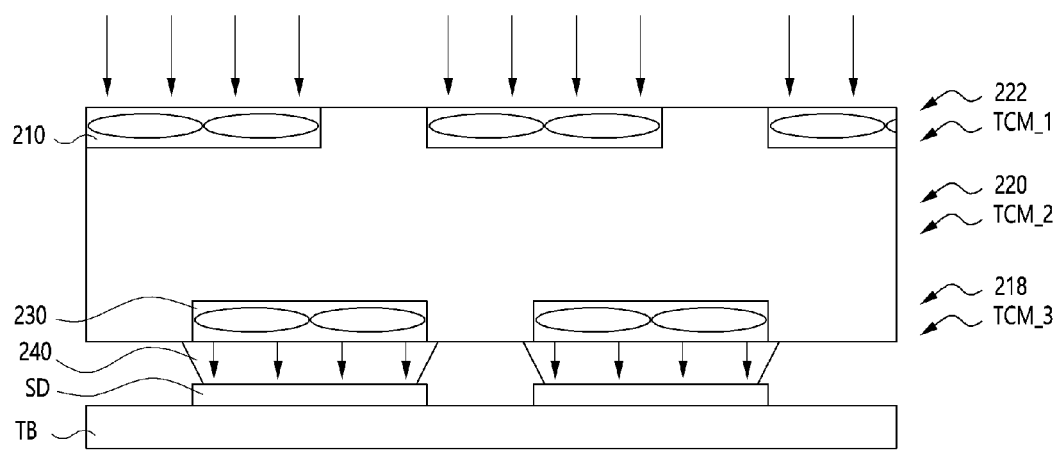

Alternatively, as shown in FIGS. 3, 6 and 7, an arrangement of the inflow units 210 may be different from an arrangement of the outflow units 230. In this case, the air introduced by the inflow units 210 may be discharged through the outflow units 230, which may have the arrangement different from the arrangement of the inflow units 210, and the air may be mixed during the movement of the air from the inflow units 210 to the outflow units 230. The mixed air may be applied to the semiconductor devices SD through the outflow units 230. The mixed air may have substantially the same temperature.

Referring to FIG. 6, the temperature control module TCM may further include an inflow plate 215 arranged between the upper region 222 and the middle region 220. In example embodiments, the inflow plate 215 may include a plurality of holes arranged in a pattern. For example, the holes of the inflow plate 215 may be arranged in a grid shape. The inflow plate 215 may control a speed and/or an amount of the air introduced into the temperature control module TCM by the inflow units 210. The air may pass through the holes of the inflow plate 215 to be mixed in accordance with the pattern of the holes. As mentioned above, the mixed air discharged through the outflow units 230 may have substantially the same temperature.

A first temperature controller TCM_1 may be arranged in the upper region 218 of the temperature control module TCM. The first temperature controller TCM_1 may be capable of heating and/or cooling the air as may be needed. Any suitable temperature controller may be employed and may include a heating element and/or a cooling element. For example, a plurality of first temperature controllers TCM_1 may be arranged over the temperature control module TCM, each one adjacent or close at a corresponding one of the inflow units 210. The first temperature controllers TCM_1 may be individually driven.

Alternatively, the first temperature controller TCM_1 may be installed at the inflow plate 215. Hence, when the air introduced by the inflow units 210 has a temperature different from a target temperature, the first temperature controller TCM_1 may control the temperature of the air to achieve the target temperature.

The air introduced by the inflow units 210 may be mixed with each other in the middle region 220 of the temperature control module TCM. As shown in FIG. 3, the middle region 220 of the temperature control module TCM may be an empty space between the inflow units 210 and the outflow units 230. Alternatively, referring to FIG. 5, a mixing plate 225 may be arranged in the middle region 220 of the temperature control module TCM. The mixing plate 225 may have a plurality of openings forming a pattern configured to effectively mix the air. Further, a mixing fan 226 may be arranged in the middle region 220 of the temperature control module TCM. A flow and a speed of the air passing through the mixing plate 225 and or the mixing fan 226 may be changed so that the air may be effectively mixed with each other.

A second temperature controller TCM_2 may be arranged in the middle region 220 of the temperature control module TCM. The second temperature controller TCM_2 may include a heating element and/or a cooling element. For example, the second temperature controller TCM_2 may be arranged in the empty space of the middle region 220. Alternatively, the second temperature controller TCM_2 may be installed at the mixing plate 225. When the air introduced by the inflow units 210 may have a temperature different from a target temperature, the second temperature controller TCM_2 may heat or cool the air to control the temperature of the air at the target temperature.

Referring to FIGS. 3 to 7, each of the outflow units 230 may apply the air, which may be mixed with each other in the middle region 220 to have the same temperature, to the semiconductor devices SD of the test board TB. In example embodiments, the outflow units 230 may also include a fan.

The outflow units 230 may be arranged in a matrix shape. In example embodiments, the outflow units 230 may be arranged to correspond to the semiconductor devices SD. That is, an arrangement of the outflow units 230 may be substantially the same as an arrangement of the semiconductor devices SD. Further, the numbers of the outflow units 230 may be substantially the same as numbers of the semiconductor devices SD.

Referring to FIG. 6, the temperature control module TCM may further include an outflow plate 235 arranged at lower ends of the outflow units 230. In example embodiments, the outflow plate 235 may include a plurality of holes arranged in a pattern. For example, the holes of the outflow plate 215 may be arranged in a grid shape. The outflow plate 235 may control a speed and/or an amount of the air discharged from the temperature control module TCM through the outflow units 230 on to the semiconductor devices.

A third temperature controller TCM_3 may be arranged in the lower region 222 of the temperature control module TCM. The third temperature controller TCM_3 may include a heating element and/or a cooling element. For example, a plurality of third temperature controllers TCM_3 may be employed, each one arranged adjacent or close to each of the outflow units 230. The third temperature controllers TCM_3 may be individually driven. Alternatively, the third temperature controllers TCM_3 may be installed at the outflow plate 235. When the air discharged through the outflow units 230 has a temperature different from a target temperature, the third temperature controllers TCM_3 may control the temperature of the air by heating it or cooling it to bring it to the target temperature. In example embodiments, the temperature control module TCM may include at least one of the first temperature controller TCM_1, the second temperature controller TCM_2 and the third temperature controller TCM_3. Each of the first, second, and third temperature controllers TCM_3 may include any suitable temperature controller. For example, the temperature controller may be capable to receive the air temperature from a temperature sensor coupled to the temperature controller, to compare the measured temperature with the target temperature, and by heating or cooling the air for adjusting the temperature as may be needed to bring the air to the target temperature.

Referring to FIG. 7, the temperature control module TCM may further include guide units 240 corresponding to the outflow units 230. Each of the guide units 240 may be arranged between the outflow unit 230 and the semiconductor device SD to directly supply the air from the outflow unit 230 to the semiconductor device SD. For example, the guide unit 240 may have a trapezoidal shape having gradually decreased widths from an upper portion to a lower portion, but the invention is not limited to this design only which is provided as an example of a suitable design for the guide unit 240. Each of the guide units 240 may be independently tilted to control an outflow direction of the air.

Referring again to FIG. 1, the temperature control module TCM may include a temperature control region and a connector TCM_C. The inflow units 210 and the outflow units 230 may be arranged in the temperature control region. The connector TCM_C may transmit the test signal to the inflow units 210 and the outflow units 230.

In example embodiments, the connector TCM_C of the temperature control module TCM may have a structure inserted into the slots 150 of the chamber 100. The connector TCM_C may be compatible with the connection TB_C of the test board TB. Thus, the temperature control module TCM may be inserted into the slot 150 to receive the test signal through an interface substantially the same as that of the test board TB.

According to example embodiments, the temperature control module TCM may have the structure inserted into the slots 150 of the chamber 100 to provide the semiconductor devices SD with the air having the same temperature regardless of the regions in the chamber 100 without changes or adding of a part in the semiconductor test device 1000.

The temperature control module TCM may further include a plurality of temperature sensors. The temperature sensors may be arranged in at least one of the upper region 222 with the inflow units 210, the middle region 220, and the lower region 218 with the outflow units 230 to continuously sense the temperature of the air introduced into the chamber 100.

Further, the temperature control module TCM may be coupled to a controller through the connector TCM_C. The controller may control the operations of the inflow units 210, the outflow units 230, the first temperature controller TCM_1, the second temperature controller TCM_2 and the third temperature controller TCM_3 based on the detected temperature of the air by the temperature sensors.

Hereinafter, a method of controlling a temperature of the air by the semiconductor test device may be illustrated in detail.

Figure 8:
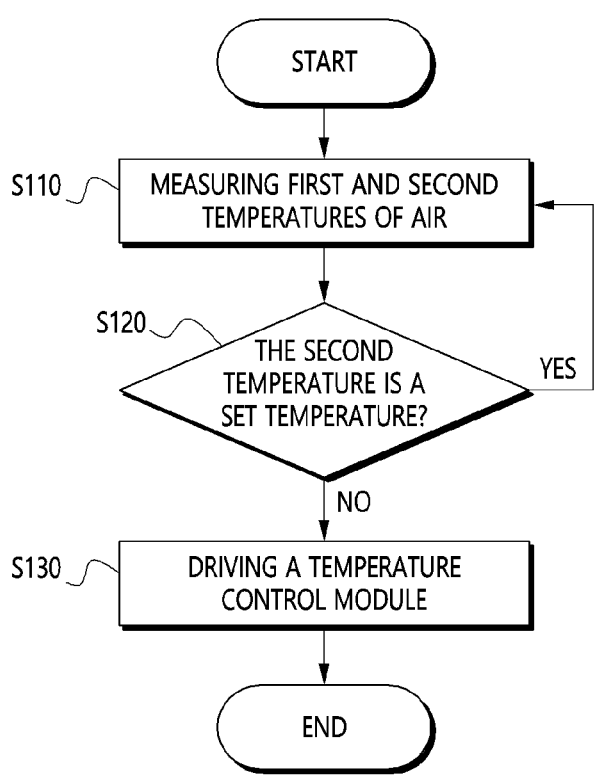
FIG. 8 is a flow chart illustrating a method of driving a semiconductor test device in accordance with example embodiments.

FIG. 8 is a flow chart illustrating a method of driving a semiconductor test device in accordance with example embodiments.

Referring to FIGS. 1, 2 and 8, in operation S110, a first temperature of the air introduced into the chamber 100 may be measured. A second temperature of the air applied to the test board TB may also be measured.

In operation S120, when the second temperature is beyond the set temperature, the temperature control module TCM may control the temperature of the second air to provide the air applied to the test board TB with the set temperature in operation S130.

In example embodiments, the inflow units 210 and the outflow units 230 of the temperature control module TCM may be independently driven to control the amount and the speed of the introduced/discharged air, thereby providing the air with the set temperature. Further, at least one of the first temperature controller TCM_1, the second temperature controller TCM_2 and the third temperature controller TCM_3 may be driven to provide the air with the set temperature.

When a difference between the second temperature and the set temperature is within an allowable range, the second temperature may be controlled by a set minimum control unit. In contrast, when a difference between the second temperature and the set temperature is beyond the allowable range, the second temperature may be repeatedly controlled by the set minimum control unit or a group of the set minimum control units to reduce a control time.

After completing the semiconductor test process, the first temperature of the air introduced into the chamber 100 and the second temperature of the air applied to the test board TB may be measured by a set period. The temperature control module TCM may provide the air with the set temperature regardless of the regions in the chamber 100.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A semiconductor test device comprising:
a chamber;
a plurality of slots arranged in the chamber;
a plurality of test boards inserted into a part of the slots to receive semiconductor devices; and
a plurality of temperature control modules inserted into another part of the slots,
wherein the temperature control modules and the test boards are alternately inserted into the slots to provide the test boards with air having a set temperature, and each of the temperature control modules comprises:
an upper region including inflow units configured to introduce the air into the chamber;
a middle region configured to mix the air introduced by the inflow units; and
a lower region including outflow units configured to apply the mixed air to the semiconductor devices on the test board.

2. The semiconductor test device of claim 1, wherein any one of the test boards and a temperature control module among the temperature control modules on one test board form one set.

3. The semiconductor test device of claim 1, wherein each of the temperature control modules is capable of cooling and/or heating the air introduced into the chamber.

4. The semiconductor test device of claim 1, wherein the outflow units have an arrangement substantially the same as an arrangement of the semiconductor devices.

5. The semiconductor test device of claim 1, wherein the inflow units have an arrangement different from an arrangement of the outflow units.

6. The semiconductor test device of claim 1, wherein the temperature control module further comprises at least one of a first temperature controller arranged in the upper region of the temperature control module, a second temperature controller arranged in the middle region of the temperature control module and a third temperature controller arranged in the lower region of the temperature control module.

7. The semiconductor test device of claim 1, wherein the temperature control module further comprises an inflow plate arranged between the inflow units and the middle region, and the inflow plate comprises a pattern including a plurality of holes.

8. The semiconductor test device of claim 1, wherein the temperature control module further comprises a mixing plate arranged in the middle region, and the mixing plate comprises a pattern including a plurality of holes.

9. The semiconductor test device of claim 1, wherein the temperature control module further comprises an outflow plate arranged between the outflow units and the semiconductor devices, and the outflow plate comprises a pattern including a plurality of holes.

10. The semiconductor test device of claim 1, wherein the temperature control module further comprises a plurality of guide units arranged between the outflow units and the semiconductor devices.

11. A semiconductor test device comprising:
a plurality of test pairs, each test pair having a test board and a temperature control module arranged inside a temperature controlled chamber having an air inlet and an air outlet,
wherein each test board includes a plurality of semiconductor devices arranged in a matrix arrangement on a surface of the test board;
wherein in each test pair the temperature control module controls the temperature of the air applied to a corresponding one of the test boards to a target temperature which is the same for all the test boards regardless of their location within the chamber, and
the temperature control module comprises:
an upper region including inflow units configured to introduce the air into the chamber;
a middle region configured to mix the air introduced by the inflow units; and
a lower region including outflow units configured to apply the mixed air to the semiconductor devices on the test board.

* * * * *